United States Patent [19]
Matsuda et al.

[11] Patent Number: 6,150,270
[45] Date of Patent: Nov. 21, 2000

[54] METHOD FOR FORMING BARRIER LAYER FOR COPPER METALLIZATION

[75] Inventors: Tetsuo Matsuda, Gunma-ken; Tadashi Iijima; Hisashi Kaneko, both of Kanagawa-ken, all of Japan

[73] Assignee: Kabushiki Kaisha Toshiba, Kawasaki, Japan

[21] Appl. No.: 09/226,722

[22] Filed: Jan. 7, 1999

[30] Foreign Application Priority Data

Jan. 7, 1998 [JP] Japan ................................. 10-001654

[51] Int. Cl.[7] .................................................. H01L 21/44
[52] U.S. Cl. ........................ 438/687; 438/691; 438/627; 438/631; 438/637; 438/675
[58] Field of Search .................... 438/687, 693, 438/691, 692, 697, 627, 631, 637, 675; 257/758

[56] References Cited

U.S. PATENT DOCUMENTS

| | | | |
|---|---|---|---|
| 4,985,750 | 1/1991 | Hoshino | 357/71 |
| 5,243,222 | 9/1993 | Harper et al. | 257/774 |
| 5,677,238 | 10/1997 | Gn et al. | 437/194 |
| 5,897,375 | 4/1999 | Watts et al. | 438/693 |
| 6,037,664 | 3/2000 | Zhao et al. | 257/758 |

OTHER PUBLICATIONS

T. Takewaki et al., "A Novel Self–Aligned Surface–Silicide Passivation Technology for Reliability Enhancement in Copper Interconnects", Symposium on VLSI Technology Digest of Technical Papers, (1995) pp. 31–32.

*Primary Examiner*—Matthew Smith
*Assistant Examiner*—V. Yevsikov
*Attorney, Agent, or Firm*—Finnegan, Henderson, Garrett & Dunner, L.L.P.

[57] ABSTRACT

A method comprises forming a barrier layer for copper metallization, selectively forming a silicon film on a surface of copper wiring formed on the main surface of a semiconductor substrate, and reacting the silicon film with a non-copper metal and/or nitrogen to form a barrier layer in a self-aligned manner relative to the copper wiring. In the method, the capacitance increase in the copper wirings formed is prevented, and the barrier layer formed has a satisfactory barrier property of protecting the copper wirings.

7 Claims, 7 Drawing Sheets

METHOD FOR FORMING BARRIER LAYER FOR COPPER METALLIZATION

BACKGROUND OF THE INVENTION

1. Field of the Invention

The present invention relates to the field of semiconductor manufacturing techniques for copper metallization, and in particular, to a method for forming barrier layer for copper metallization.

2. Description of the Prior Art

Heretofore, in general, aluminum wirings have been being used in LSI. Copper wirings are being developed in the art as low-resistance metal wirings having higher electric conductivity and reliability over Al wirings. The specific resistivity of copper is around 1.8 $\mu\Omega\cdot$cm or so, while that of aluminum is around 2.9 $\mu\Omega\cdot$cm or so, and it is expected that copper wirings will bring about the reduction in electric resistance of around 40% or so, when compared with aluminum wirings.

However, in realizing copper wirings, there are many difficulties that must be overcome with respect to the process for forming them. Still now, therefore, aluminum is the mainstream of the wiring material for LSI from the birth of LSI where aluminum was first used for wirings.

Essential problems with the process of forming copper wirings are as follows: The first is that copper RIE (reactive ion etching) is difficult to attain and therefore copper wiring patterns are difficult to form. The second is that copper diffuses through interlayer insulating films (silicon oxide films) due to heat and electric field, thereby often having some negative influences on the other devices in LSI and causing electric leak through wirings therein. The third is that copper is easily oxidized in an oxidizing process to form an oxide film. Since the oxide film is thick and its mechanical and chemical strength is low, it interferes with the formation of good copper wirings.

The first problem could be solved by a technique of embedding a metal in grooves (in a so-called damascene-wiring process) with no RIE to form wiring patterns. On the other hand, the second and third problems could be solved by covering the wiring patterns with a barrier material (conductor, insulator)

Figure 1:
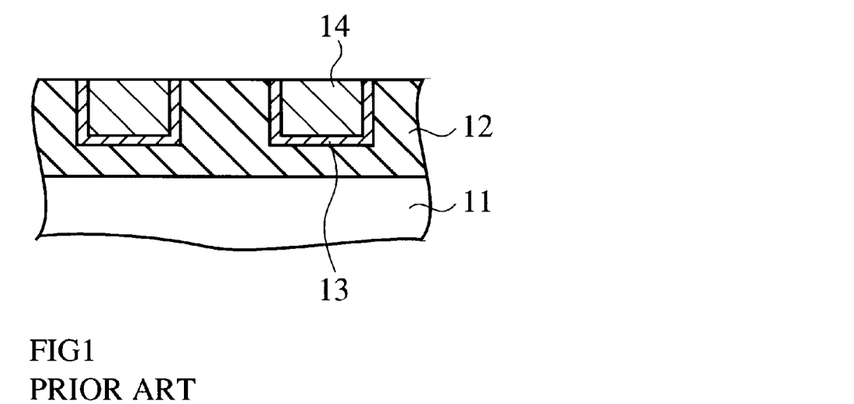
FIG. 1 is a cross-sectional view showing one example of the conventional technique.

As in FIG. 1, barrier layer 13 is formed around the inner surface of each damascene groove as formed in an interlayer insulating film 12 on a semiconductor substrate 11, whereby the bottom and the side surface of copper wiring 14 could be covered with the barrier layer 13. However, in this, any other method must be employed for forming barrier layer to cover the top of the copper wiring 14. For this, some methods have heretofore been proposed, such as those mentioned below.

Figure 2:
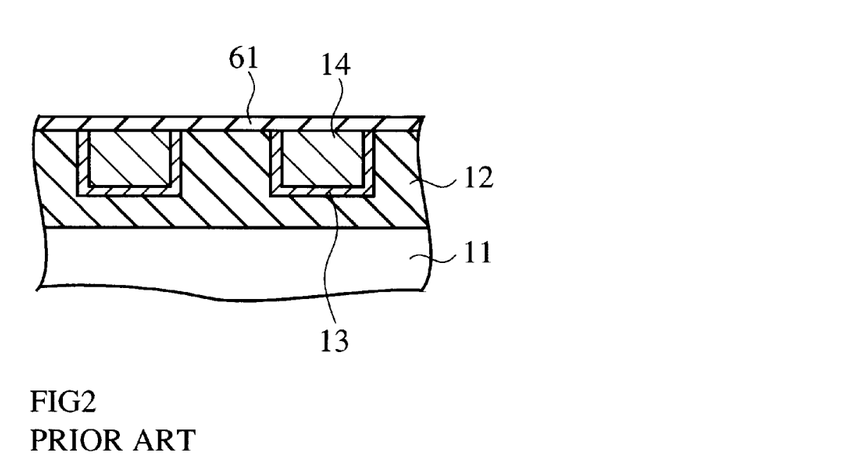
FIG. 2 is a cross-sectional view showing another example of the conventional technique.
Figure 3:
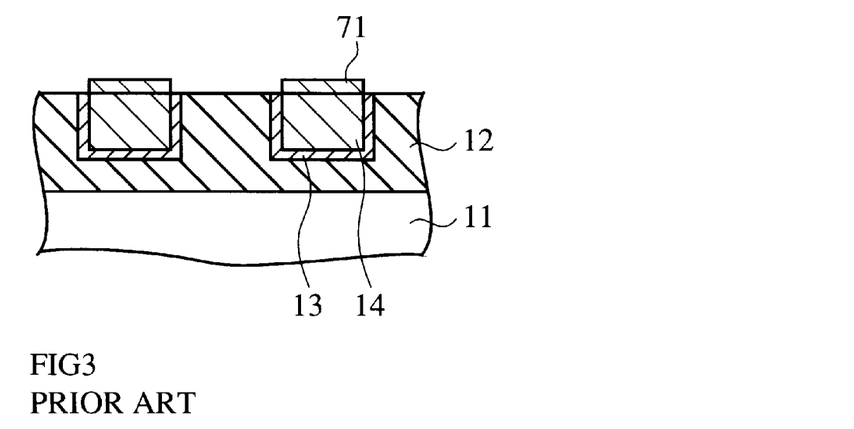
FIG. 3 is a cross-sectional view showing still another example of the conventional technique.
Figure 4A:
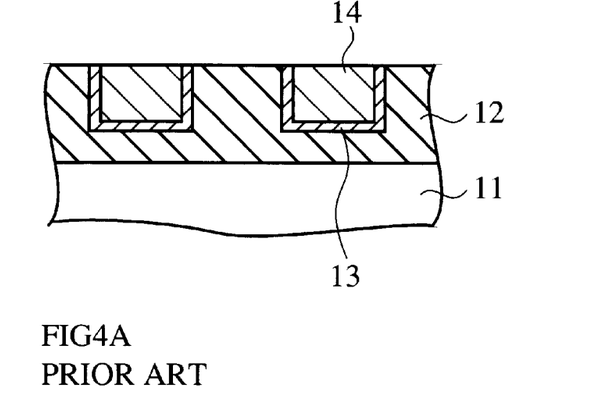
FIGS. 4A to 4C are cross-sectional views showing a process of still another example of the conventional technique.
Figure 4B:
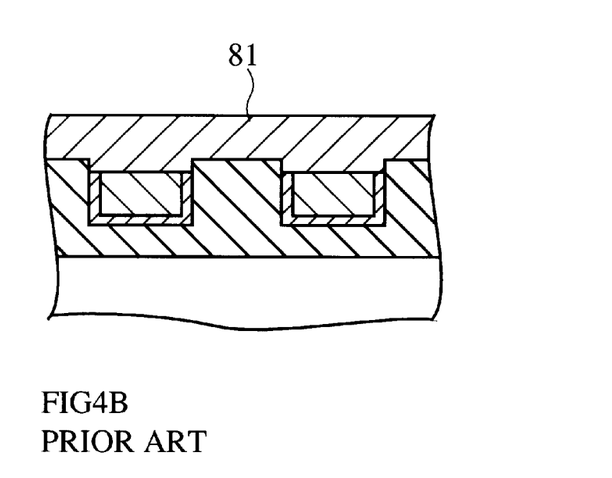
Figure 4C:
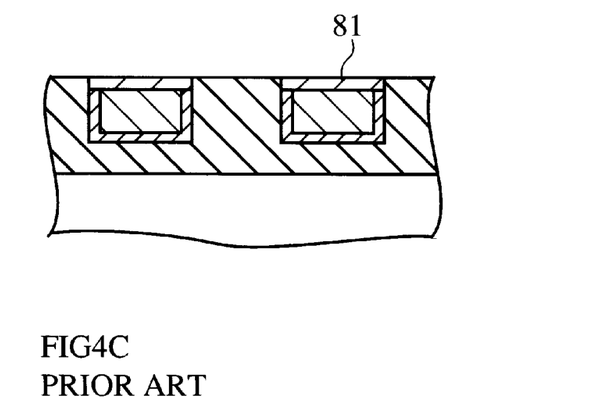

The first method comprises forming copper wiring 14 followed by covering the entire surface with an insulating barrier layer 61 of, for example SiN, as in FIG. 2. The second method comprises forming copper wiring 14 followed by forming a barrier metal layer 71 selectively on the copper wiring 14 through electroless plating or selective metal CVD, as in FIG. 3. The third method comprises, as in FIGS. 4A to 4C, forming barrier layer 13 and copper wiring 14 in each damascene groove (FIG. 4A), then etching (o recessing) the copper wiring 14 and forming barrier layer 81 on the entire surface by the use of ,e.g. sputtering or CVD method (FIG. 4B), and finally embedding the barrier layer 81 in the etched recesses by the use of ,e.g. chemical mechanical polishing method according to a damascene process (FIG. 4C).

However, the first method is problematic in that the capacitance between the wirings is increased due to the SiN film 61 formed on the interlayer insulating film 12 around the copper wiring 14 and having a high dielectric constant, thereby lowering the acting speed of LSI. The second method is problematic in that the selective formation of the barrier layer is difficult to control and therefore the short-circuit margin between the wirings is low, and that a chloride or a chlorine formed in WCVD corrodes the copper wiring 14. In the third method, the structure formed is such that the barrier layer is embedded in the site in which the recesses are formed,the thickness of the interlayer insulating film in that structure must be increased according to the thickness of the barrier layer. As a result, therefore, the third method is problematic in that the process controllability in the direction of thickness is not good.

Takewaki, et al. say that $SiH_4$ gas decomposes and Si deposits on Copper interconnect surface in the temperature range of 150° C.~400° C. (T. Takewaki, et al., *A Novel Self-Aligned Surface-Silicide Passivation Technology for Reliability Enhancement in Copper Interconnections*, 1995 Symposium on VLSI Technology). On the basis of that phenomenon, Takewaki, et al. tried forming a copper silicide on the surface of copper wirings to improve the reliability of the wirings. However, their proposal is problematic in that the copper silicide could not satisfactorily function as a film for preventing copper diffusion or oxidation.

Even though hopeful for low-resistance metal wirings, copper is still problematic in that it diffuses through interlayer insulating films and is easily oxidized in an oxidation process to form an oxide film having low mechanical and chemical strength. Therefore, as so mentioned hereinabove, forming barrier layer around copper wirings is indispensable. However, the conventional barrier layer-forming methods are problematic in that the capacitance in the wirings formed is increased and that the barrier layer formed could not satisfactorily function as a film for preventing copper diffusion or oxidation.

SUMMARY OF THE INVENTION

To achieve the above object, the present invention provides a method for forming barrier layer for copper metallization in which the capacitance in the copper wirings formed is prevented from being increased and in which is formed barrier layer having a satisfactory barrier property of protecting the copper wirings.

The method for forming barrier layer for copper metallization of the invention comprises selectively forming a silicon film on a surface of copper wiring formed on a main surface of a semiconductor substrate, and reacting the silicon film with at least one substance that does not substantially contain copper to form barrier layer (silicon compound film)

In forming a silicon film, for example, silane or a silane compound may be used for forming a silicon film selectively on the surface of copper wiring.

At least one element that does not substantially contain copper includes, for example, nitrogen and metals except copper. Accordingly, forming barrier layer may be any of the following:

(a) The silicon film formed is reacted with nitrogen to form barrier layer containing silicon and nitrogen. Concretely, a silicon nitride barrier layer is formed through nitridation of silicon.

(b) The silicon film formed is reacted with a metal that does not substantially contain copper to form barrier layer containing silicon and the non-copper metal. Concretely, a film of a metal that does not substantially contain copper is formed on the entire surface, and then subjected to heat treatment for reacting the non-copper metal with silicon on the silicon film to form a silicide thereon, and thereafter the non-copper metal still remaining on the area except the silicon film is removed. In this step where the non-copper metal is reacted with silicon to form a silicide, copper of the copper wiring will also be reacted with silicon to form a copper silicide. In that case, formed is a mixed silicide of the non-copper metal silicide and the copper silicide.

(c) The silicon film formed is reacted with a metal that does not substantially contain copper and with nitrogen to form barrier layer containing silicon, nitrogen and the non-copper metal. Typically formed is a Ti-containing ternary barrier layer (TiSiN film), for which is used Ti as the non-copper metal.

According to the invention mentioned above, the silicon film as selectively formed on the exposed surface of the copper wiring is reacted with nitrogen or a metal that does not substantially contain copper, whereby is formed barrier layer in a self-aligned manner relative to the copper wiring. Owing to the barrier layer formed, copper is prevented from being diffused or oxidized, and semiconductor devices with high reliability can be obtained. In addition, in the invention, since the barrier layer is formed selectively and in a self-aligned manner relative to the copper wiring, the capacitance between copper wirings is prevented from being increased, which, however, is inevitable and problematic in the conventional method of forming a silicon nitride film on the entire surface.

(d) In another aspect, the method for forming a semiconductor device of the invention comprises selectively forming a silicon film on the surface of copper wiring as formed on the main surface of a semiconductor substrate, and substituting the silicon film with a metal that does not substantially contain copper to form barrier layer. The non-copper metal includes, for example, W and Mo.

In the step of forming a silicon film in (a) to (d) noted above, for example, silane or a silane compound may be used for forming a silicon film selectively on the surface of copper wiring.

According to the invention, the silicon film having been selectively formed on the exposed surface of the copper wiring maybe substituted with a non-copper metal to form barrier layer in a self-aligned manner relative to the copper wiring. The barrier layer thus formed acts to prevent copper diffusion or oxidation. Therefore, in the invention, produced are semiconductor devices having high reliability.

Other objects, features, and advantages of the invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the invention and many of its attendant advantages will be readily obtained by reference to the following detailed description considered in connection with the accompanying drawings, in which.

DESCRIPTION OF REFERRED EMBODIMENTS OF THE INVENTION

Preferred embodiments of the present invention will be described in detail with reference to the drawings.

Figure 5A:
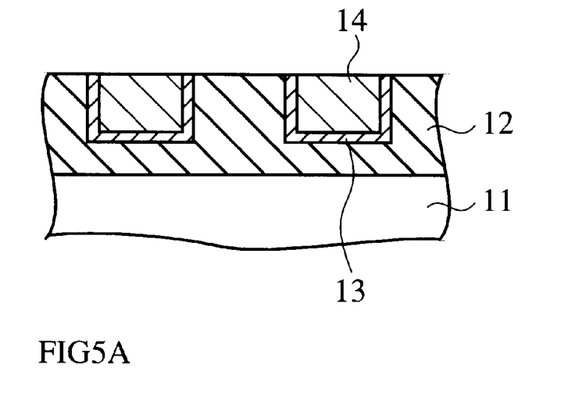
FIGS. 5A to 5C are cross-sectional views showing a process of the first embodiment of the invention, in which a silicon nitride film is formed as the barrier layer above the copper wiring.
Figure 5B:
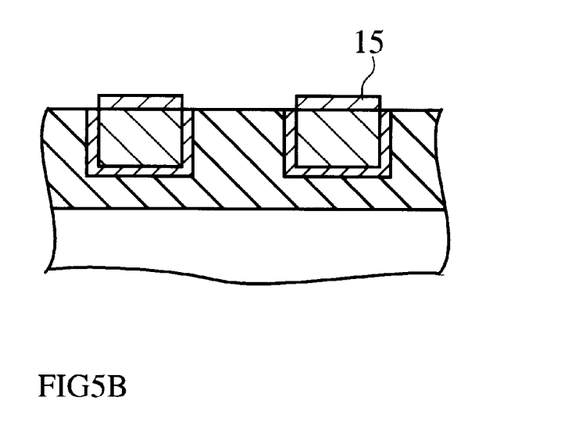
Figure 5C:
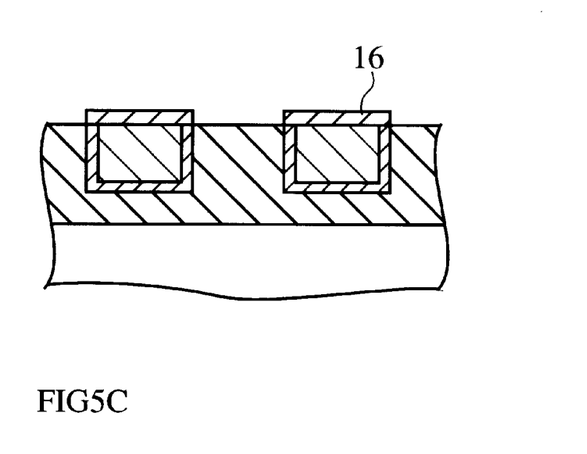

Referring now to FIGS. 5A to 5C, the first embodiment of the present invention is described.

Wiring grooves are first formed in the surface of an interlayer insulating film 12, such as a silicon oxide film, as formed on a semiconductor substrate 11, such as a silicon substrate. Though not shown, semiconductor chips such as transistors and others are formed on the silicon substrate 11. Next, a TiN film (titanium nitride film) 13, which is to be a barrier metal layer for the bottom and the side surface of the copper wiring to be formed, is formed on the entire surface through chemical sputtering, and thereafter copper wiring 14 is formed through electrolytic plating. Next, all the TiN film 13 and the copper film 14 except those in the grooves are entirely removed through CMP (chemical mechanical polishing). Thus is formed the embedded copper wiring (FIG. 5A).

The substrate thus having the copper wiring 14 formed thereon is introduced into a closed container, which is filled with a monosilane ambient under a pressure of 5 Torr, and kept therein at a substrate temperature of 300° C., for 30 minutes. As a result, a silicon film 15 is selectively formed on the surface of the copper wiring 14. The thickness of the silicon film 15 is between about 30 Å and about 100 Å (FIG. 5B).

Next, the substrate thus having the silicon film 15 formed on the surface of the copper wiring 14 is transported into a plasma nitriding process chamber preferably without breaking the vacuum atmosphere around it, and this is processed therein for parallel tabular RF plasma discharging (oscillation frequency: 13.56 MHz, power density: 2 W/cm$^2$) in nitrogen gas under a pressure of 1 Torr, for 10 minutes. In this step, any other gas except nitrogen, such as e.g. hydrogen gas, oxygen gas, may be introduced into the chamber along with the nitrogen gas. As a result of this plasma treatment, the silicon film 15 is nitrided into a silicon nitride film (SiN film) 16 (FIG. 5C).

After the steps noted above, the silicon nitride film 16 to be barrier layer is formed in a self-aligned manner above the copper wiring 14. It has been confirmed that the thin silicon nitride film 16 thus selectively formed above the copper wiring 14 has few influences on the capacitance increase in the copper wirings formed and functions effectively as barrier layer for preventing copper diffusion and oxidation.

The second embodiment of the present invention is described with reference to FIGS. 6A to 6D, in which the same or corresponding constituent elements as or to those in the first embodiment illustrated in FIGS. 5A to 5C are referred to by way of the same numeral references as in FIGS. 5A to 5C.

Figure 6A:
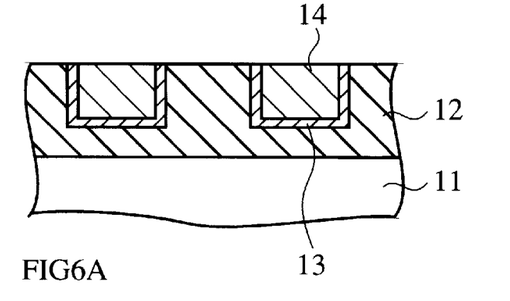
FIGS. 6A to 6D are cross-sectional views showing a process of the second embodiment of the invention, in which a TiSiN film is formed as the barrier layer above the copper wiring.
Figure 6B:
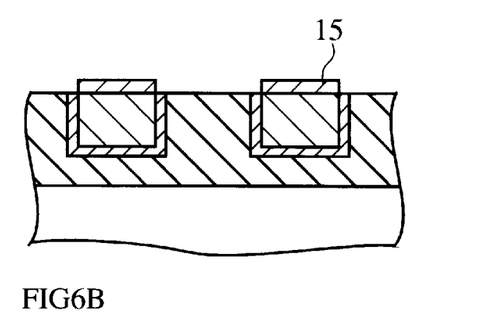

The steps of FIG. 6A and FIG. 6B are the same as those in FIG. 5A and FIG. 5B for the first embodiment.Briefly, copper wiring 14 is formed via a TiN film 13 to be a barrier metal layer, in the wiring grooves formed in an interlayer insulating film 12 (FIG. 6A), and thereafter a silicon film 15 is selectively formed on the surface of the copper wiring 14 through heat treatment with a monosilane (FIG. 6B).

Figure 6C:
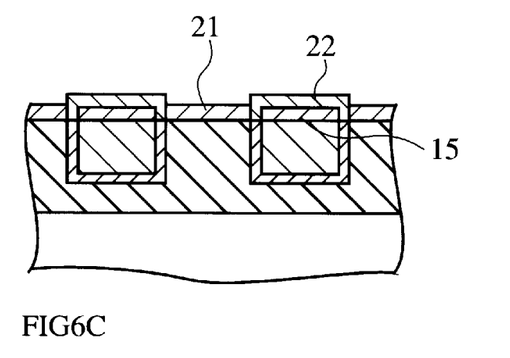

Next, the substrate thus having the silicon film 15 formed on the surface of the copper wiring 14 is transported into a sputtering chamber preferably without breaking the vacuum atmosphere around it. In the chamber, Ti is sputtered onto it through magnetron sputtering, for which the target is Ti, the pressure is 3 Pa, the ratio of argon to nitrogen in the mixed atmosphere of argon and nitrogen is 1/1, and the power is 1 kW. As a result of this sputtering, a TiN film 21 is formed on the interlayer insulating film 12, and a thin, ternary amorphous film of Ti—Si—N (TiSiN film 22) is around the silicon film 15 (FIG. 6C)

Figure 6D:
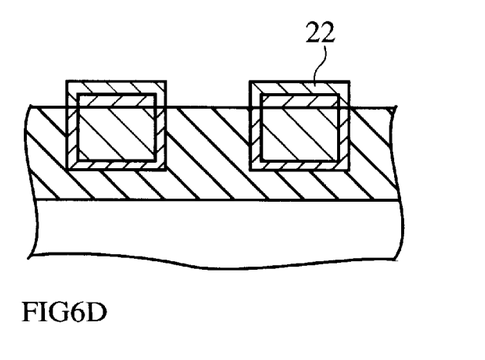

Next, the TiN film 21 is selectively etched away with aqueous hydrogen peroxide, while the TiSiN film 22 is left on the silicon film 15 (FIG. 6D).

As in the above, the TiSiN film 22 to be barrier layer is formed in a self-aligned manner to cover the copper wiring 14. It has been confirmed that, even though thin, the TiSiN film 22 thus formed selectively and above the copper wiring 14 functions effectively as barrier layer for preventing copper diffusion and oxidation. The second embodiment of the present invention has solved the problem with the second embodiment of the conventional method for barrier layer formation through selective WCVD in which the selective barrier layer formation is difficult to control, and therefore has solved the problem with it in which the short-circuit margin in the wirings formed is low.

In the second embodiment of the present invention as illustrated herein, used is Ti as the sputtering target. Apart from this, any other metal (for example, W, Ta, etc. ) may also be used in the same manner as above to form a ternary barrier layer having the same effect as above.

The third embodiment of the present invention is described with reference to FIGS. 7A to 7E, in which the same or corresponding constituent elements as or to those in the first embodiment illustrated in FIGS. 5A to 5C are referred to by way of the same numeral references as in FIGS. 5A to 5C.

Figure 7A:
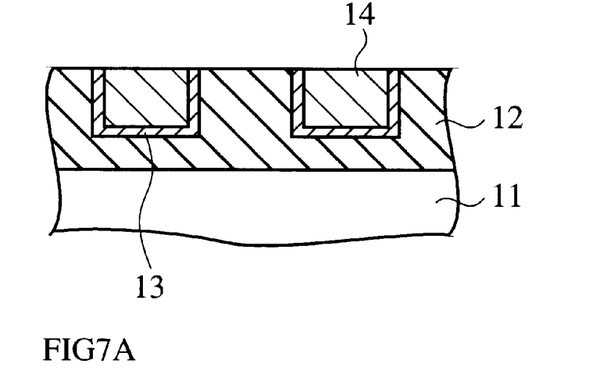
FIGS. 7A to 7E are cross-sectional views showing a process of the third embodiment of the invention, in which a silicide film is formed as the barrier layer above the copper wiring.
Figure 7B:
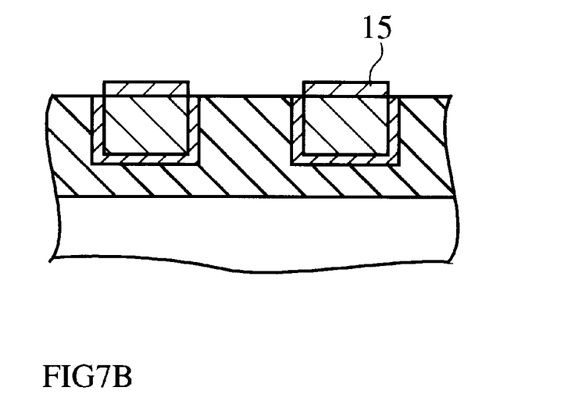

The steps of FIG. 7A and FIG. 7B are the same as those in FIG. 5A and FIG. 5B for the first embodiment. Briefly, copper wiring 14 is formed via a TiN film 13 to be a barrier metal layer, in the wiring grooves formed in an interlayer insulating film 12 (FIG. 7A), and thereafter a silicon film 15 is selectively formed on the surface of the copper wiring 14 through heat treatment with a monosilane (FIG. 7B).

Figure 7C:
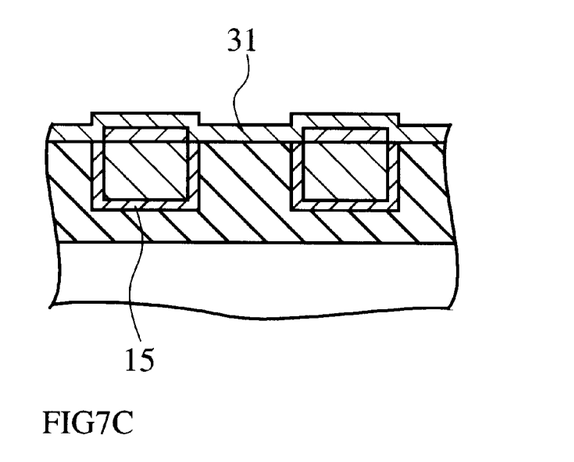

Next, the substrate thus having the silicon film 15 formed on the surface of the copper wiring 14 is transported into a sputtering chamber preferably without breaking the vacuum atmosphere around it. In the chamber, Ni is sputtered onto it through magnetron sputtering, for which the target is Ni, the pressure is 3 Pa, the atmosphere is of argon, and the power is 1 kW. As a result of this sputtering, an Ni film 31 is formed on the entire surface (FIG. 7C).

Figure 7D:
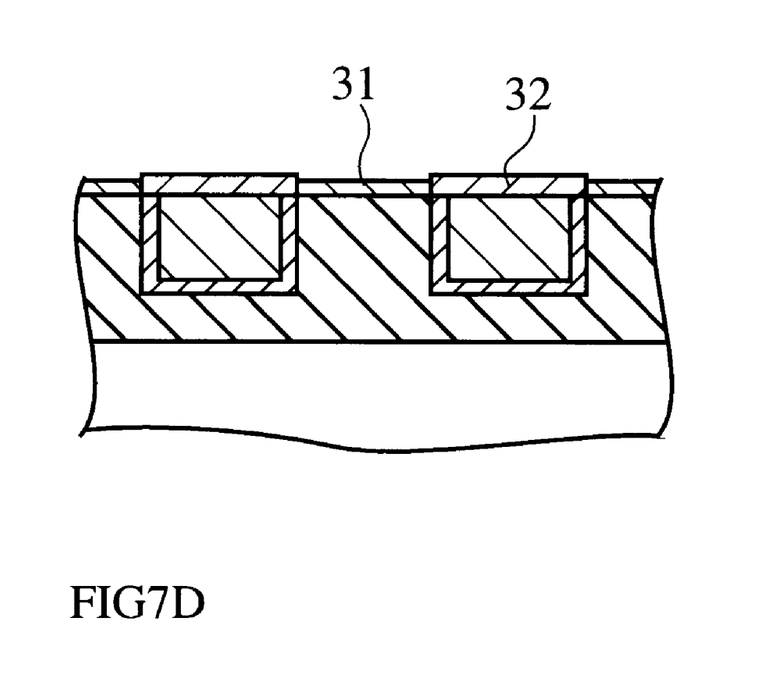

Next, this is annealed at a substrate temperature of 350° C., whereby Si is reacted with Ni to form an NiSi film (Ni silicide) above the copper wiring 14. In this step, also formed is a Cu silicide. In fact, therefore, a mixed silicide film 32 of Ni silicide and Cu silicide is formed (FIG. 7D).

Figure 7E:
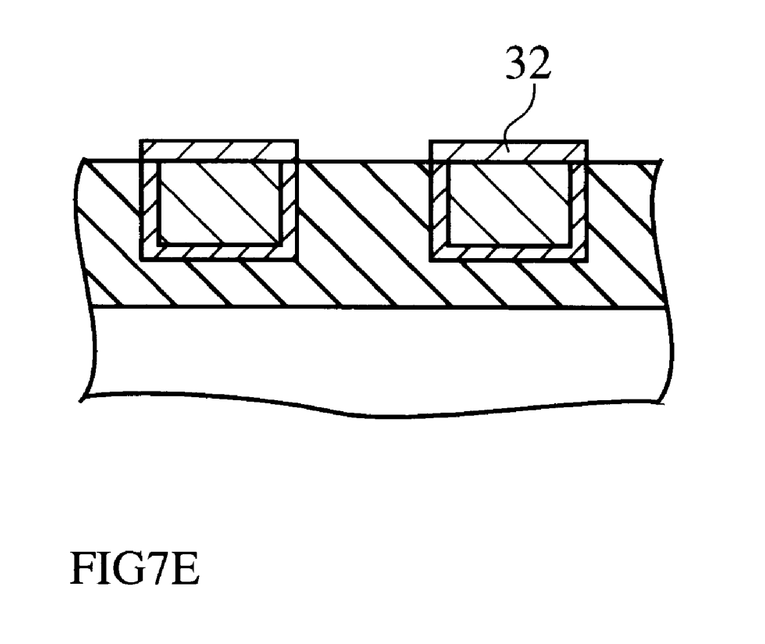

Next, the Ni film 31 on the interlayer insulating film 12 is selectively etched away with a mixture of aqueous hydrogen peroxide and $H_2SO_4$, while the silicide film 32 is selectively left on the copper wiring 14 (FIG. 7E).

As in the above, the silicide film 32 to be barrier layer is formed in a self-aligned manner to cover the copper wiring 14. The silicide film 32 thus formed selectively above the copper wiring 14 functions effectively as barrier layer for preventing copper diffusion and oxidation. The third embodiment of the present invention has solved the problem with the second embodiment of the conventional method for barrier layer formation through selective WCVD in which the selective barrier layer formation is difficult to control, and therefore has solved the problem with it in which the short-circuit margin in the wirings formed is low.

In the third embodiment of the present invention as illustrated herein, used is Ni as the sputtering target. Apart from this, any other metal (for example, W, Ta, Co, Pt, Pd, etc.) may also be used in the same manner as above to form barrier layer of a silicide having the same effect as above. However, for ultra-fine wiring, it is desirable that the metal essentially participates in the diffusion for silicidation since the silicide formed bleeds out little. For that case, therefore, metal such as e.g. Ni, Co is preferably used.

The fourth embodiment of the present invention is described with reference to FIGS. 8A to 8C, in which the same or corresponding constituent elements as or to those in the first embodiment illustrated in FIGS. 5A to 5C are referred to by way of the same numeral references as in FIGS. 5A to 5C.

Figure 8A:
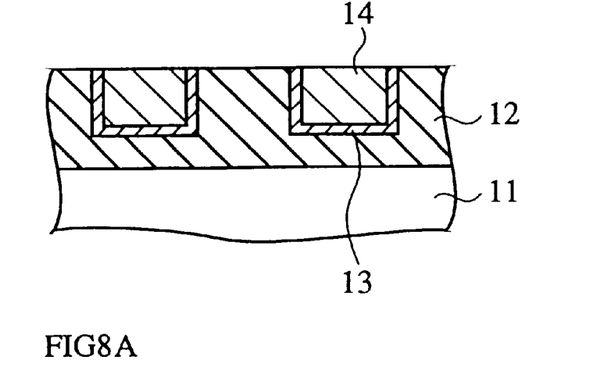
FIGS. 8A to 8C are cross-sectional views showing a process of the fourth embodiment of the invention, in which a W film is formed as the barrier layer above the copper wiring.
Figure 8B:
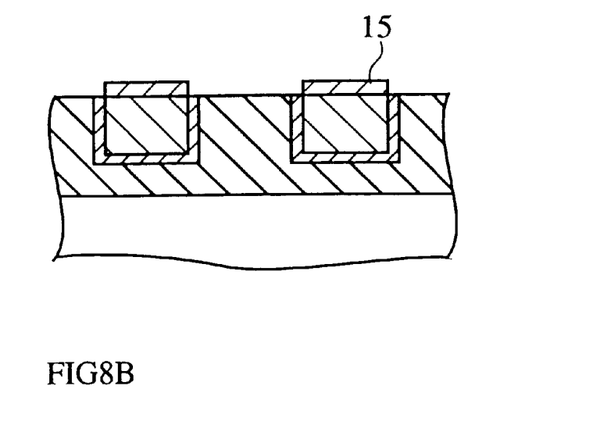
Figure 8C:
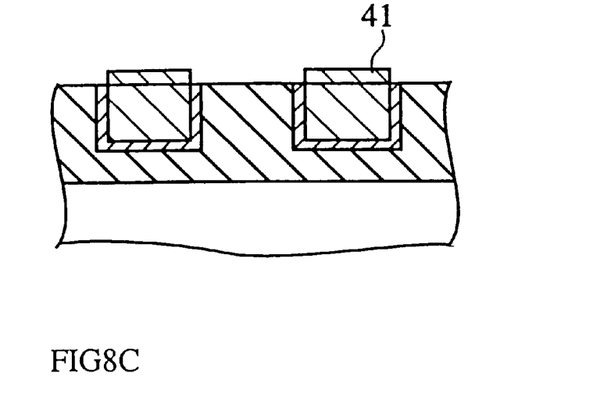

The steps of FIG. 8A and FIG. 8B are the same as those in FIG. 5A and FIG. 5B for the first embodiment.Briefly, copper wiring 14 is formed via a TiN film 13 to be a barrier metal layer, in the wiring grooves formed in an interlayer insulating film 12 (FIG. 8A), and thereafter a silicon film 15 is selectively formed on the surface of the copper wiring 14 through heat treatment with a monosilane (FIG. 8B).

Next, the substrate thus having the silicon film 15 formed on the surface of the copper wiring 14 is transported into a processing chamber preferably without breaking the vacuum atmosphere around it. In the chamber, the silicon film 15 is processed through W-CVD using $WF_6$ or $WF_6$ and $H_2$, to thereby replace it with a W film 41. Thus is formed the W film 41 selectively on the copper wiring 14 (FIG. 8C).

As in the above, the W film 41 to be barrier layer is formed in a self-aligned manner to cover the copper wiring 14. The W film 41 thus formed selectively above the copper wiring 14 functions effectively as barrier layer for preventing copper diffusion and oxidation. The fourth embodiment of the present invention has solved the problem with the second embodiment of the conventional method noted above in which the chloride formed through W-CVD corrodes the copper wiring 14 formed, since the silicon film 15 formed herein functions as a protective film during W-CVD.

While there has been illustrated and described what are presently considered to be preferred embodiments of the present invention, it will be understood by those skilled in the art that various changes and modifications may be made, and equivalents may be substituted for process thereof without departing from the spirit and scope of the present invention. For example, it may be taken into consideration to form recesses to a desired depth in the site where the barrier layer is formed above the copper wiring, in any step after the copper wiringing step, and to apply silicidation with Copper wiring to the silicon film 15. Further, the conditions of the process may subject to various modification without departing from the scope of the present invention which is contained in the recited claims that follow.

What is claimed is:

1. A method for forming a barrier layer for copper metallization, which comprises selectively forming a silicon film on a surface of copper wiring formed on a main surface of a semiconductor substrate, and reacting the silicon film with at least one substance that does not substantially contain copper to form a barrier layer.

2. The method for forming a barrier layer for copper metallization as claimed in claim 1, wherein reacting the silicon film with nitrogen to form a barrier layer containing silicon and nitrogen in the barrier layer forming step.

3. The method for forming a barrier layer for copper metallization as claimed in claim 1, wherein reacting the silicon film with a metal that does not substantially contain copper to form a barrier layer containing silicon and the metal in the barrier layer forming step.

4. The method for forming a barrier layer for copper metallization as claimed in claim 1, wherein reacting the silicon film with a metal that does not substantially contain copper and with nitrogen to form a barrier layer containing silicon, nitrogen and the metal.

5. The method for forming a barrier layer for copper metallization as claimed in claim 1, wherein silane or a silane compound is used for forming the silicon film selectively on the surface of the copper wiring in the silicon film forming step.

6. A method for forming a barrier layer for copper metallization, which comprises selectively forming a silicon film on a surface of copper wiring formed on a main surface of a semiconductor substrate, and substituting the silicon film with a metal that does not substantially contain copper to form a barrier layer.

7. The method for forming a barrier layer for copper metallization as claimed in claim 6, wherein silane or a silane compound is used for forming the silicon film selectively on the surface of the copper wiring in the silicon film forming step.

\* \* \* \* \*